United States Patent
Chachad et al.

(10) Patent No.: US 8,732,398 B2
(45) Date of Patent: May 20, 2014

(54) ENHANCED PIPELINING AND MULTI-BUFFER ARCHITECTURE FOR LEVEL TWO CACHE CONTROLLER TO MINIMIZE HAZARD STALLS AND OPTIMIZE PERFORMANCE

(75) Inventors: Abhijeet Ashok Chachad, Plano, TX (US); Raguram Damodaran, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 191 days.

(21) Appl. No.: 13/245,211

(22) Filed: Sep. 26, 2011

(65) Prior Publication Data

US 2012/0260031 A1    Oct. 11, 2012

Related U.S. Application Data

(60) Provisional application No. 61/387,283, filed on Sep. 28, 2010.

(51) Int. Cl.
*G06F 13/00* (2006.01)
(52) U.S. Cl.
USPC ......................................... 711/122; 711/118

(58) Field of Classification Search
None
See application file for complete search history.

(56) References Cited

U.S. PATENT DOCUMENTS

| | | | | |
|---|---|---|---|---|
| 5,581,727 A | * | 12/1996 | Collins et al. | 711/135 |
| 5,742,790 A | * | 4/1998 | Kawasaki | 711/128 |
| 5,752,264 A | * | 5/1998 | Blake et al. | 711/144 |
| 5,826,052 A | * | 10/1998 | Stiles et al. | 712/205 |
| 6,021,471 A | * | 2/2000 | Stiles et al. | 711/140 |
| 6,119,205 A | * | 9/2000 | Wicki et al. | 711/143 |
| 6,148,372 A | * | 11/2000 | Mehrotra et al. | 711/122 |
| 6,226,713 B1 | * | 5/2001 | Mehrotra | 711/118 |
| 6,363,462 B1 | * | 3/2002 | Bergsten | 711/162 |
| 7,003,628 B1 | * | 2/2006 | Wiedenman et al. | 711/118 |
| 2005/0225558 A1 | * | 10/2005 | Morein et al. | 345/557 |

* cited by examiner

*Primary Examiner* — Matthew Bradley
*Assistant Examiner* — Ramon A Mercado
(74) *Attorney, Agent, or Firm* — Robert D. Marshall, Jr.; W. James Brady; Frederick J. Telecky, Jr.

(57) ABSTRACT

This invention is a data processing system including a central processing unit, an external interface, a level one cache, level two memory including level two unified cache and directly addressable memory. A level two memory controller includes a directly addressable memory read pipeline, a central processing unit write pipeline, an external cacheable pipeline and an external non-cacheable pipeline.

16 Claims, 6 Drawing Sheets

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

ENHANCED PIPELINING AND MULTI-BUFFER ARCHITECTURE FOR LEVEL TWO CACHE CONTROLLER TO MINIMIZE HAZARD STALLS AND OPTIMIZE PERFORMANCE

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache for digital data processors.

BACKGROUND OF THE INVENTION

This invention is applicable to data processing systems with second level (L2) memory used for both unified (code and instructions) level two cache and flat (L2 SRAM) memory used to hold critical data and instructions. Such a second level memory has multiple endpoints and use cases for the corresponding memory controller. This level two memory controller can access level two SRAM, level two cache and external memories. This memory controller receives access requests from different requestors including the central processing unit (CPU) for data and instructions, internal cache block operations and internal or slave direct memory access (DMA) units. These access requests can have multiple destinations including flat memory (L2 SRAM), level two cache and external endpoints. These access requests can be of four types including reads, writes, victims and allocates.

The number of permutations of transactions possible for requestor/endpoint pairs is large. All memory transfers require the highest bandwidth possible. These permutations of possible transactions can be divided into three major types. The first type of these permutations include different requestors to different endpoint destinations. These requests should not interfere with each other and their performance should not affect each other. The second type of these permutations include different requestors to the same endpoint. These transactions should see a change in performance only when there is an actual conflict in resources. The third type of these permutations include the same requestor to different endpoints. These transactions should be able to proceed in parallel with their only interaction being on the interface between the requestor and the controller. All types of accesses should be independent of external influences such as stalls from external endpoints.

SUMMARY OF THE INVENTION

This invention is a data processing system including a central processing unit, an external interface, a level one cache, level two memory including level two unified cache and directly addressable memory. A level two memory controller includes a directly addressable memory read pipeline, a central processing unit write pipeline, an external cacheable pipeline and an external non-cacheable pipeline.

The level two controller includes four arbitration units. A directly addressable memory read pipeline arbitration unit selects only one of a plurality of requests the directly addressable read pipeline. A level two memory pipeline arbitration unit selects only one of a plurality of requests to the level two memory and for enforcing a same read/write ordering from the same requestor. A tag arbitration unit selects only one of a plurality of requests to external cache tag RAM. An external bus arbitration unit selects only one of a plurality of requests to an external interface. The external interface includes an external command buffer, an external write data buffer, an external read response buffer, an external write allocate buffer and an external read data buffer.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
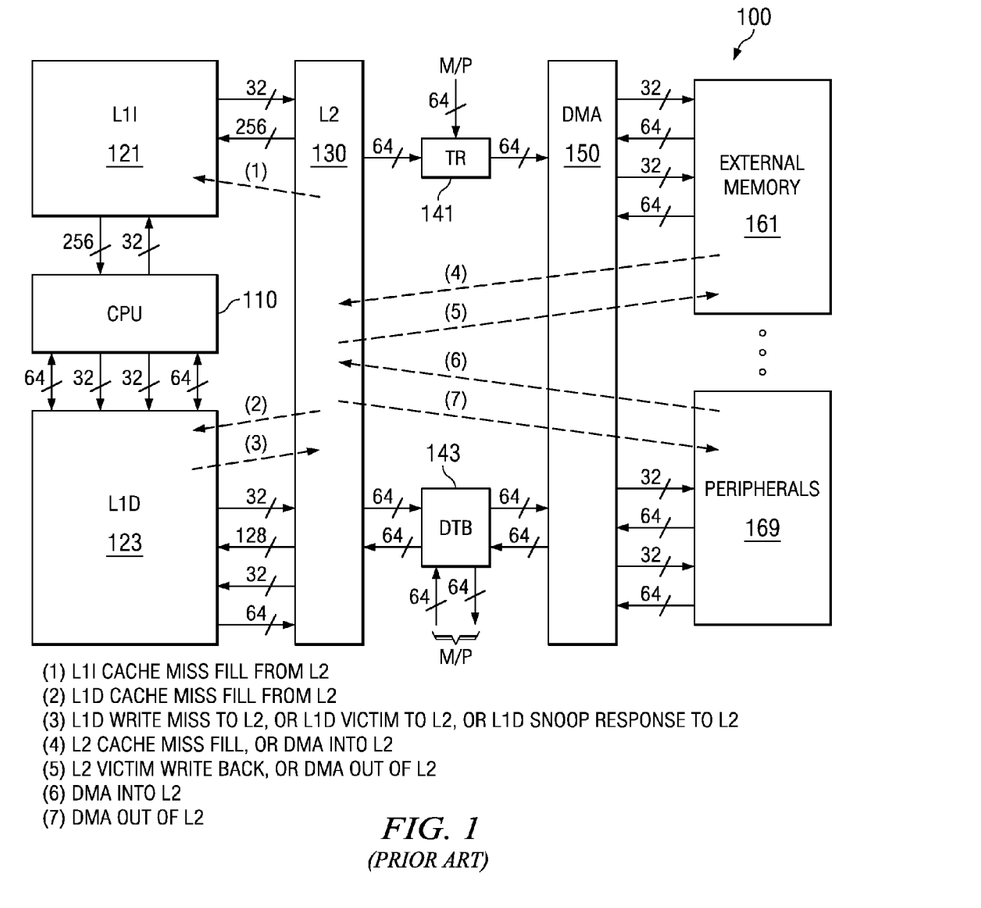
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically include a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
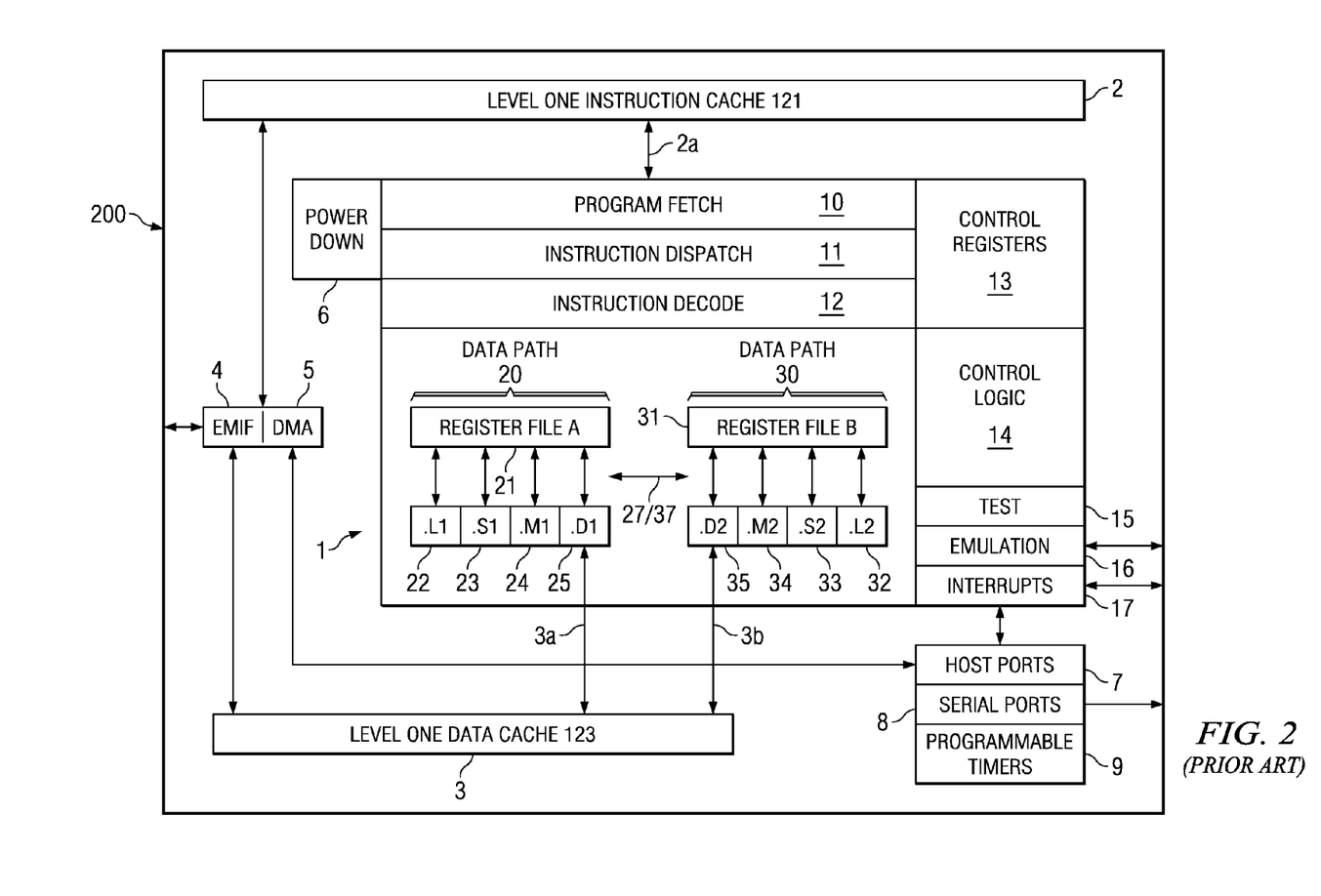
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123.

Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
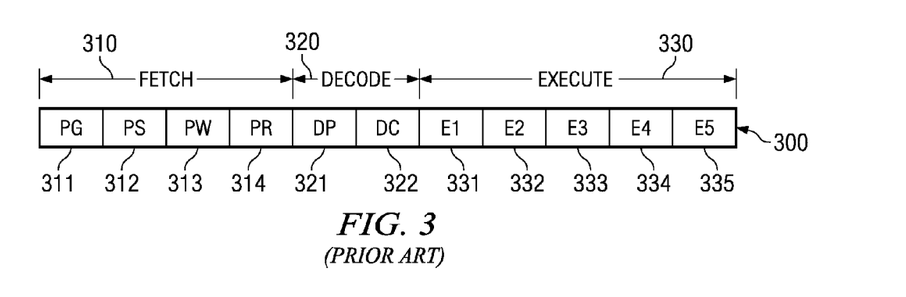
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
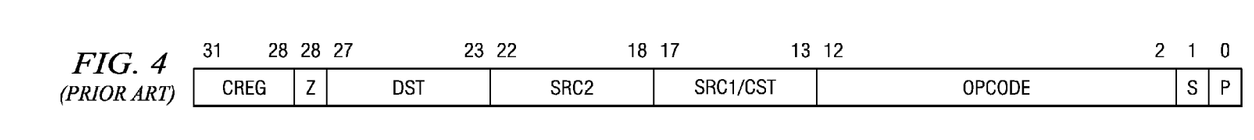
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional Register | creg | | | z |
|---|---|---|---|---|
| | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Figure 5:
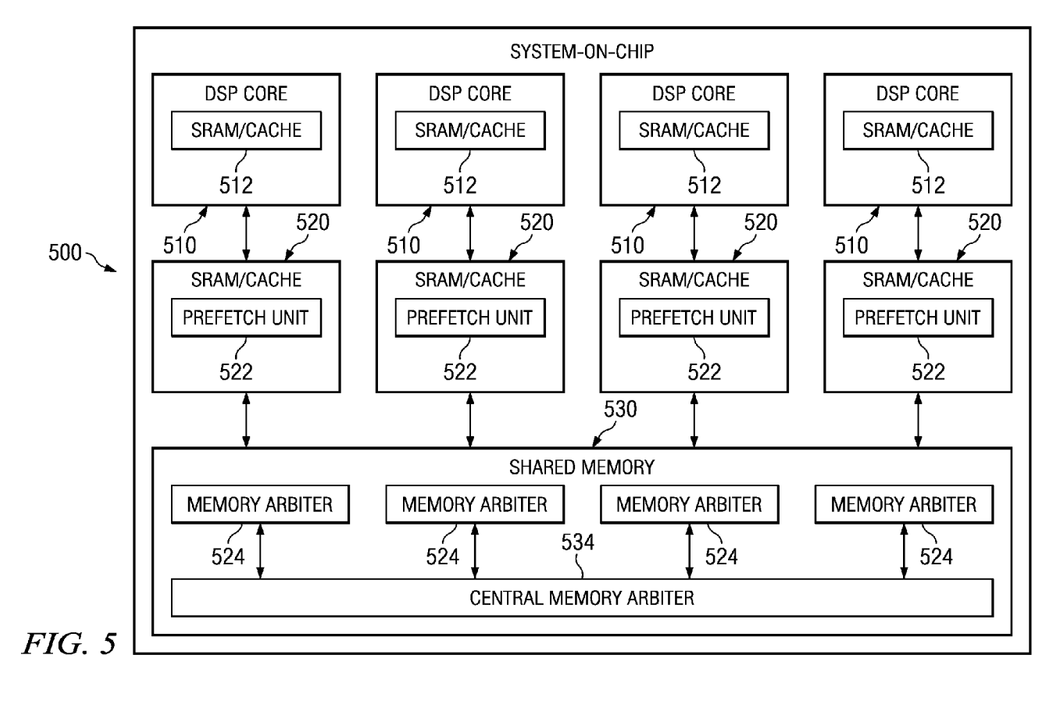
FIG. 5 illustrates a computing system including a local memory arbiter according to an embodiment of the invention.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
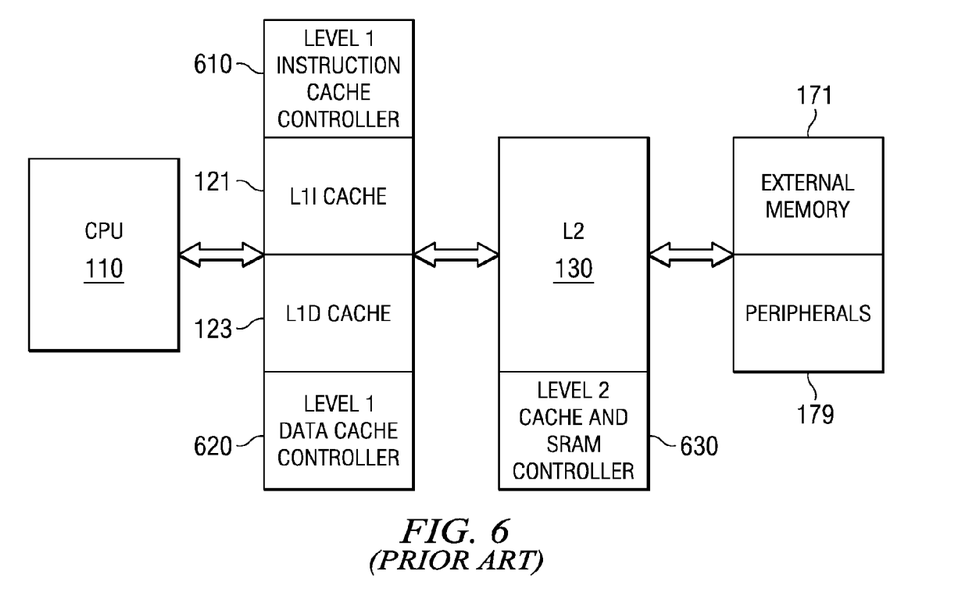
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 130 is in turn bidirectionally connected to external memory 161 and peripherals 169. External memory 161 and peripherals 169 are shown together because they are at the same level in the memory hierarchy. Data transfers into and out of L1I cache 121 is controlled by level 1 instruction cache controller 610. Data transfers into and out of L1D cache 123 is controlled by level 1 data cache controller 620. Data transfers into and out of L2 130 including both cache and directly addressable memory (SRAM) are controlled by level 2 cache and SRAM controller 630. This application is primarily concerned with level 2 cache and SRAM controller 630.

This invention applies to the only CPU initiated transactions. This invention excludes DMA initiated transactions.

Figure 7:
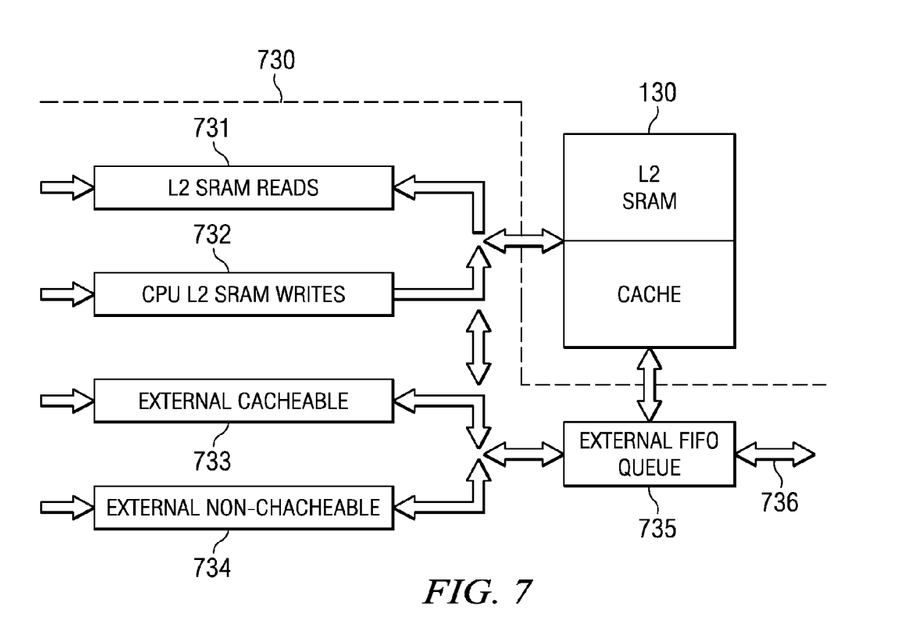
FIG. 7 illustrates the multiple pipelines of the level two cache and SRAM controller according to this invention.

FIG. 7 illustrates the multiple pipelines of level two cache and SRAM controller 730 according to this invention. Level two cache and SRAM controller 730 of this invention replaces level two cache and SRAM controller 630 of the prior art. L2 SRAM reads pipeline 731 is used for L2 SRAM reads. This is a single stage pipeline for transactions which originate from CPU 110 either at level one instruction cache controller 610 or level one data cache controller 620 which are reads from L2 SRAM. A program fetch could generate a cache miss in L1I cache 121 or a CPU load could generate a cache miss in L1D cache 123 to data stored in L2 SRAM 130. Either case generates an allocate read from L2 130. These transactions can proceed on an independent short pipeline. These require no memory protection or permission checks before the request is sent to the endpoint because they are reads. These checks are still performed. Upon a failure of such a check instead of dropping the transaction the data returns with special status bits that indicate the pass/fail status of the read. These transactions are from level one cache controllers which can cache the read data. These cache controllers can signal the CPU of a fail status of the read. Because these transactions are to L2 SRAM 130, no tag RAM needs to be consulted to make a hit/miss decision.

CPU L2 SRAM writes pipeline 732 handles CPU writes to L2 SRAM. These writes need to check security and memory protection permissions. The write transaction aborts if the access does not have sufficient privileges.

External cacheable pipeline 733 handles external cacheable accesses. This is a variable stage pipeline for all transactions that are to external addresses. Writes need to check security and memory protection permissions. The write transaction aborts if the access does not have sufficient privileges. Accesses to external addresses check the tag RAM. Upon a hit, this pipeline becomes a 3-stage pipeline. L2 cache and SRAM controller 730 accesses the cache and processes this transaction. Accesses that miss L2 cache, go on to an extra pipeline stage. These transactions are packaged, written to a buffer (external FIFO queue 735 further described below) and sent on external interface 736. The transactions include all cache related transactions such as allocates and victims. User initiated cache block transactions also scheduled on this pipeline.

There are several types of programmer initiated cache block operations in the preferred embodiment of this invention. CPU 110 specifies the type of operation such as writeback/invalidate, writeback and invalidate only. CPU 110 specifies an address range for the cache block operation. When triggered the cache block operation performs the specified cache operation on the designated range of addresses. In the preferred embodiment the block operation controller checks cache tags over the address range and performs the operation upon a hit.

External non-cacheable pipeline 734 handles external non-cacheable accesses. Because tag RAM does not need to be consulted this pipeline can be shorter than external cacheable pipeline 733. These accesses may be cached in the level one controller and thus can be victims, read and writes. Thus these transactions need to be scheduled to go to the external endpoint.

Since both level one instruction cache controller 610 and level one data cache controller 620 send requests to these endpoints, they need to arbitrate for access to the pipeline. The goal is to keep all pipelines going in parallel. The rules applied to this arbitration are only to ensure that read-write ordering is maintained from the same requestor.

Figure 8:
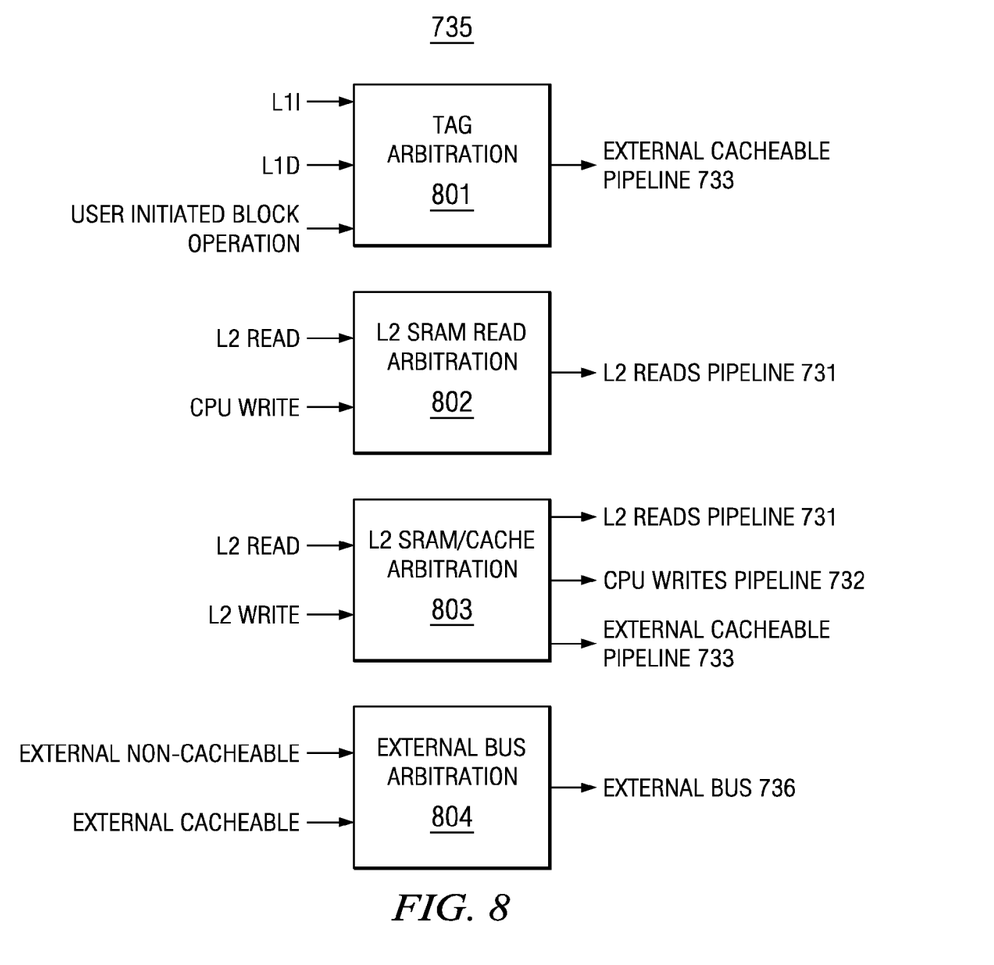
FIG. 8 illustrates four types of arbitration units according to the preferred embodiment of this invention.

FIG. 8 illustrates the four types of arbitration units according to the preferred embodiment of this invention.

Tag arbitration 801 performs the first of these arbitrations. Tag arbitration 801 has three requestors L1I cache 121, L1D cache 123 and user initiated cache block operations. The winner of this arbitration is granted access to the external cacheable pipeline 733 to check cache tag RAM. Arbitration occurs on every cycle.

L2 SRAM read arbitration 802 performs the second type of arbitration. Since CPU writes go on CPU L2 SRAM writes pipeline 732, a transaction is scheduled on L2 read pipeline 731 only when this read does not break the read/write ordering from the same requestor. This arbitration preserves the coherence of the read/write ordering.

L2 SRAM/L2 cache arbitration 803 performs the third type of arbitration. L2 SRAM reads pipeline 731, CPU L2 SRAM writes pipeline 732 and external cacheable pipeline 733 all need access to the same L2 130 because this memory can be used as both L2 SRAM and L2 cache. This arbitration of L2 SRAM/L2 cache arbitration 803 is on a request basis and occurs every cycle. Since for these transactions the read/write ordering is enforced at a different point, L2 SRAM/L2 cache arbitration 803 does not need to do any such checks.

External bus arbitration 804 controls access to external interface bus 736. Both external cacheable pipeline 733 and external non-cacheable pipeline 734 may need to send a transaction out of level two cache and SRAM controller 630. Both these use the same external bus 736. Arbitration occurs every cycle. There are no order rules to be enforced here because they actually go to different endpoints even if they use the same interface.

Figure 9:
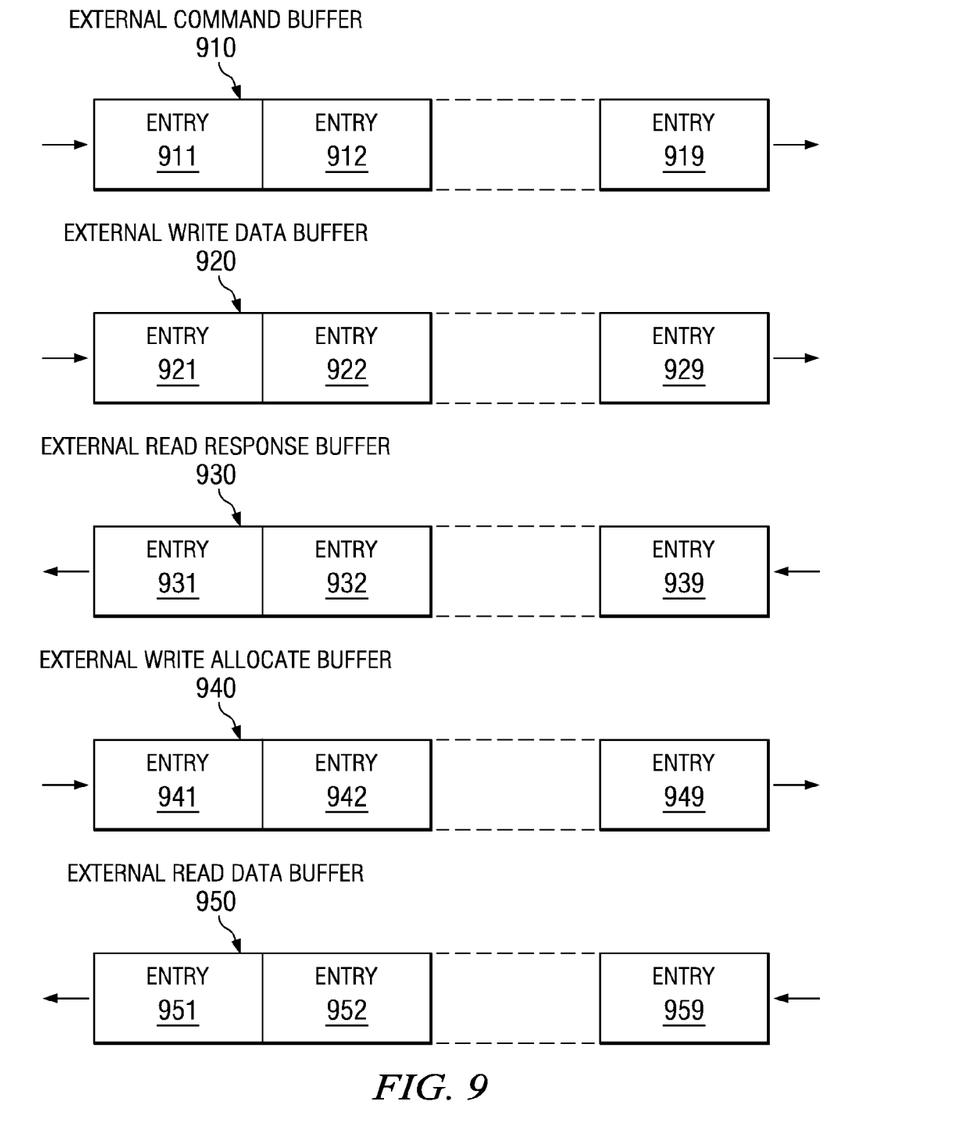
FIG. 9 illustrates five buffer types used in this invention.

It is critical that each pipeline be able to run at greatest throughput even when there are external stalls. Each pipeline has multiple buffers. The advantage over a single buffer is that different types of transactions require different combinations of buffers. There are preferably five types of buffers. FIG. 9 illustrates these five buffer types. The left of the drawing corresponds to the internal bus and the right of the drawing corresponds to external bus 736.

External command buffer 910 is first type of buffer. External command buffer 910 includes plural entries 911, 912 to 919. External command buffer 910 holds commands from level two cache and SRAM controller 730 to read data in or write data out to an external endpoint. Each CPU transaction uses 1 entry irrespective of the size of the read/writes or whether it is an allocate or not. Victims require separate entry.

External write data buffer 920 is second type of buffer. External write data buffer 920 includes plural entries 921, 922 to 929. External write data buffer 920 holds the write data corresponding to a write command. Unlike external command buffer 910, each transaction occupies multiple entries based upon data size. Table 2 shows number of entries needed for each write type assuming that each entry width is half the length of the L1D cache line.

TABLE 3

| Write Type | Number of Entries |
|---|---|
| CPU Long distance write | 1 |
| L1D Victim | 2 |
| L2 Victim | 4 |

External read response buffer 930 is the third type buffer. External read response buffer 930 includes entries 931, 932 to 939. External read response buffer 930 holds information corresponding to read data returned from the endpoint. External read response buffer 930 does not hold the actual data, but information such as CPU address, allocate way, byte position for write allocate and the number of data phases needed by the level one instruction controller 610 or level one data controller 620.

External write allocate buffer 940 is the fourth type buffer. External write allocate buffer 940 includes plural entries 941, 942 to 949. External write allocate buffer 940 holds the write allocate data. Write allocates operate as fire and forget. Thus write allocates are issued by level two cache and SRAM controller 730, but the controller does not stall waiting for the write allocate to finish. Data from this buffer is merged with the data returned from the endpoint.

External read data buffer 950 is the fifth type buffer. External read buffer 950 includes plural entries 951, 952 to 959. External read data buffer 950 holds the actual data returned by the external endpoint. External read data buffer 950 allows pipelined acceptance of the data when level two cache and SRAM controller 730 is unable to consume it or write the allocate data to the cache.

Previous solutions had complex arbitration and ordering rules for the pipelines. The prior art had just 2 pipelines with very complicated interaction. The prior art pipelines were endpoint based. Thus each scheduled requestor had to arbitrate in each stage of the pipeline.

The pipeline architecture of thus invention lets multiple transactions proceed in parallel without interference. Arbitration occurs at the head of the pipeline. Once the decision is made there is no interaction with any other pipeline. Thus all pipelines are effectively independent. For different endpoints, the pipelines proceed at almost 100% throughput. This is a performance improvement over prior art. Stalls from one pipeline do not affect or stall the others. This improves the latency of all types of transactions by a huge factor.

The buffers enable each pipeline flow at full throughput and are somewhat immune to external variations. For example if an external endpoint does not respond with read data, it is possible to continue external writes going since they use different buffers.

What is claimed is:

1. A data processing system comprising:
    a central processing unit executing program instructions to manipulate data;
    an external interface;
    at least one level one cache connected to said central processing unit temporarily storing at least one of program instructions for execution by said central processing unit and data for manipulation by said central processing unit;
    a level two memory connected to said at least one level one cache, said level two memory including
        a level two unified cache temporarily storing instructions and data for supply of instructions and data to said at least one level one cache, and
        a directly addressable memory; and
    a level two memory controller connected to said at least one level one cache, said level two memory and said external interface, said level two memory controller including
        a directly addressable memory read pipeline connected to said at least one level one cache receiving read requests for data stored in said directly addressable memory,
        a central processing unit write pipeline receiving central processing write requests to addressed stored in said directly addressable memory,
        an external cacheable pipeline receiving read accesses and write accesses to external memory at cacheable addresses, and
        an external non-cacheable pipeline receiving read accesses and write accesses to external memory at non-cacheable addresses.

2. The data processing system of claim 1, wherein:
    said read requests of said directly addressable memory read pipeline are generated by cache misses in said at least one level one cache.

3. The data processing system of claim 2, further comprising:
    a directly addressable memory read pipeline arbitration unit connected to said central processing unit, said at least one level one cache, said a directly addressable memory read pipeline and said external cacheable pipeline for selecting only one of a plurality of requests to said external cacheable pipeline to check cache tag RAM.

4. The data processing system of claim 1, wherein:
    said at least one level one cache includes
        a level one instruction cache connected to said central processing unit temporarily storing program instructions for execution by said central processing unit, and
        a level one data cache connected to said central processing unit temporarily storing data for manipulation by said central processing unit.

5. The data processing system of claim 4, wherein:
    a program fetch of said central processing unit causing a cache miss in said level one instruction cache generates a read request of said directly addressable memory.

6. The data processing system of claim 4, wherein:
    a data load operation of said central processing unit causing a cache miss in said level one data cache generates a read request of said directly addressable memory.

7. The data processing system of claim 4, wherein:
    a data store operation of said central processing unit causing a cache miss in said level one data cache and a write allocate generates a read request of said directly addressable memory.

8. The data processing system of claim 4, further comprising:
    a level two memory pipeline arbitration unit connected to said central processing unit, said at least one level one cache, said directly addressable memory read pipeline, said central processing unit write pipeline and said external cacheable pipeline for selecting only one of a plurality of requests to said level two memory and for enforcing a same read/write ordering from the same requestor.

9. The data processing system of claim 1, wherein:
said directly addressable memory read pipeline performs no memory protection or permission checks of said read requests.

10. The data processing system of claim 1, wherein:
said directly addressable memory read pipeline memory performs memory protection or permission checks of said read requests and upon failure of a memory protection or permission check said read requests returns special status bits that indicate fail status.

11. The data processing system of claim 1, wherein:
said central processing unit write pipeline performs memory protection or permission checks of said write requests and upon failure of a memory protection or permission check aborts said write request.

12. The data processing system of claim 1, wherein:
said external cacheable pipeline performs memory protection or permission checks of write requests and upon failure of a memory protection or permission check aborts said write request.

13. The data processing system of claim 1, wherein:
said level two memory includes a tag RAM storing addresses of data stored within said level two unified cache; and
said external cacheable pipeline compares an address corresponding to a request to said tag RAM, said external cacheable pipeline
  servicing a request from said level two unified cache upon a hit in said tag RAM, and
  servicing a request from external memory via the external memory interface upon a miss in said tag RAM.

14. The data processing system of claim 13, further including:
a tag arbitration unit connected to said at least one level one cache and said external cacheable pipeline for selecting only one of a plurality of external cacheable requests to said tag RAM.

15. The data processing system of claim 1, further including:
an external bus arbitration unit connected to said external cacheable pipeline, said external non-cacheable pipeline and said external interface for selecting only one of a plurality of external cacheable requests and external non-cacheable requests to said external interface.

16. The data processing system of claim 1, wherein:
said external interface includes a first-in-first-out buffer having
  an external command buffer having plural entries, each entry holding commands to read data in or write data out to an external endpoint,
  an external write data buffer including plural entries, each entry holding write data corresponding to a write command,
  an external read response buffer including a plurality of entries, each entry holding information corresponding to read data returned from an external endpoint,
  an external write allocate buffer including plural entries, each entry holding write allocate data, and
  an external read data buffer including plural entries, each entry holding actual data returned by an external endpoint in response to a read request.

* * * * *